(12) United States Patent  
Liu

(10) Patent No.: US 9,659,952 B2  
(45) Date of Patent: *May 23, 2017

(54) NAND MEMORY ARRAY WITH MISMATCHED CELL AND BITLINE PITCH

(71) Applicant: INTEL CORPORATION, Santa Clara, CA (US)

(72) Inventor: Zengtao Liu, Boise, ID (US)

(73) Assignee: Intel Corporation, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/931,784

(22) Filed: Nov. 3, 2015

(65) Prior Publication Data

US 2016/0118393 A1    Apr. 28, 2016

Related U.S. Application Data

(63) Continuation of application No. 13/993,312, filed as application No. PCT/US2011/052846 on Sep. 22, 2011, now Pat. No. 9,208,881.

(51) Int. Cl.
| | |
|---|---|
| H01L 27/11565 | (2017.01) |
| G11C 16/02 | (2006.01) |
| H01L 27/11582 | (2017.01) |
| H01L 27/1157 | (2017.01) |
| H01L 27/11573 | (2017.01) |

(52) U.S. Cl.
CPC ........ *H01L 27/11565* (2013.01); *G11C 16/02* (2013.01); *H01L 27/1157* (2013.01); *H01L 27/11573* (2013.01); *H01L 27/11582* (2013.01)

(58) Field of Classification Search
None
See application file for complete search history.

(56) References Cited

U.S. PATENT DOCUMENTS

| 7,709,334 | B2 | 5/2010 | Lai et al. |
| 2002/0137503 | A1 | 9/2002 | Roderique |
| 2004/0155324 | A1 | 8/2004 | Sasaki |
| 2007/0158736 | A1 | 7/2007 | Arai et al. |
| 2008/0025093 | A1 | 1/2008 | Scheuerlein et al. |
| 2010/0097858 | A1 | 4/2010 | Tokiwa et al. |
| 2010/0323460 | A1 | 12/2010 | Nagashima |
| 2011/0019486 | A1* | 1/2011 | Jang .................. G11C 16/0483 365/185.25 |

(Continued)

FOREIGN PATENT DOCUMENTS

| JP | 2003-007868 A | 1/2003 |
| JP | 2007-180389 A | 7/2007 |
| JP | 2010-102755 A | 5/2010 |

(Continued)

OTHER PUBLICATIONS

International Search Report and Written Opinion mailed Apr. 30, 2012 from International Application No. PCT/US2011/052846.

(Continued)

*Primary Examiner* — James G Norman  
(74) *Attorney, Agent, or Firm* — Compass IP Law PC

(57) ABSTRACT

Embodiments of the present disclosure describe methods, apparatus, and system configurations for NAND memory arrays with mismatched cell and bitline pitch. Other embodiments may be described and claimed.

27 Claims, 5 Drawing Sheets

(56) References Cited

U.S. PATENT DOCUMENTS

2012/0320652 A1    12/2012    Kono

FOREIGN PATENT DOCUMENTS

| JP | 2011-003642 A | 1/2011 |
| JP | 2011-28833 A | 2/2011 |
| JP | 2013-004778 A | 1/2013 |

OTHER PUBLICATIONS

Notification Concerning Transmittal of International Preliminary Report on Patentability mailed Apr. 3, 2014 from International Application No. PCT/US2011/052846.
Office Action issued Oct. 21, 2014 from Japanese Patent Application No. 2014-531772.
Office Action issued Jan. 30, 2015, Korean Patent Application No. 10-2014-7007359, 11 pages.
Final Notice of Reasons for Rejection mailed Feb. 24, 2015, issued in corresponding Japanese Patent Application No. 2014-531772, 3 pages.
Jang, J., et al., "Vertical Cell Array using TCAT(Terabit Cell Array Transistor) Technology for Ultra High Density NAND Flash Memory," pp. 192-193, 2009 Symposium on VLSI Technology Digest of Technical Papers.

\* cited by examiner

NAND MEMORY ARRAY WITH MISMATCHED CELL AND BITLINE PITCH

CROSS REFERENCE TO RELATED APPLICATIONS

The present application is a continuation of U.S. patent application Ser. No. 13/993,312, filed Jun. 11, 2013, which is a national phase entry under 35 U.S.C. §371 of International Application No. PCT/US2011/052846, filed Sep. 22, 2011, entitled "NAND MEMORY ARRAY WITH MISMATCHED CELL AND BITLINE PITCH," and the entire contents and disclosures of which are hereby incorporated by reference in their entireties.

FIELD

Embodiments of the present disclosure generally relate to the field of integrated circuits, and more particularly, to a NAND memory array with mismatched cell and bitline pitch.

BACKGROUND

In a NAND memory array, all the memory cells in a page are programmed and read at the same time. So, in principle, the larger the page size, the greater the parallelization of the program/read operations. This will result in higher data throughput provided that the program/read operations themselves are not greatly degraded as a result of the larger page size. Historically, NAND page size has steadily increased from generation to generation in order to support higher and higher data throughput, even though the program/read timing has been degrading in general. The increases in page size are possible due to the fact that the cell pitch scales down from generation to generation.

A page will include all of the memory cells (in an all-bitline (ABL) architecture) or half of the memory cells (in a shielded bitline (SBL) architecture) along a single wordline in an array plane. Limitations of a size of a die limit the absolute length of the wordlines (i.e., the width of an array plane). That sets an upper limit on the number of memory cells that can be placed along a single wordline. So, with matched bitline and cell pitch, the page size that can be supported is limited for a given cell pitch.

The limitation on page size has not been a significant issue for NAND because the cell pitch has been steadily decreasing from generation to generation as a result of cell scaling, which enables page size increases within the die-size limitation. However, as conventional NAND scaling comes to an end, future NAND scaling may be achieved by three-dimensional (3-D) NAND memory arrays.

In 3-D NAND memory arrays, the cell size in the wordline direction is limited by a cell channel thickness (in the form of a pillar or line), a gate stack thickness (tunnel oxide, charge trapping layer, and blocking oxide), and a gate electrode thickness. As a result, the cell pitch in the wordline direction will be significantly bigger than conventional, i.e., 2-D NAND memory arrays. While density-wise, the larger cell pitch can be compensated by the fact that multiple layers of cells are stacked on top of one another, the page size will have to come down because of the larger cell pitch, with everything else being equal (die architecture, package size, etc.). Thus, the data throughput of 3-D NAND memory arrays may be significantly degraded compared to 2-D NAND memory arrays, limiting their competitiveness.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example and not by way of limitation in the figures of the accompanying drawings.

DETAILED DESCRIPTION

In the following detailed description, reference is made to the accompanying drawings which form a part hereof wherein like numerals designate like parts throughout, and in which is shown by way of illustration embodiments that may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

Various operations may be described as multiple discrete actions or operations in turn, in a manner that is most helpful in understanding the claimed subject matter. However, the order of description should not be construed as to imply that these operations are necessarily order dependent. In particular, these operations may not be performed in the order of presentation. Operations described may be performed in a different order than the described embodiment. Various additional operations may be performed and/or described operations may be omitted in additional embodiments.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B and C).

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

Figure 1:
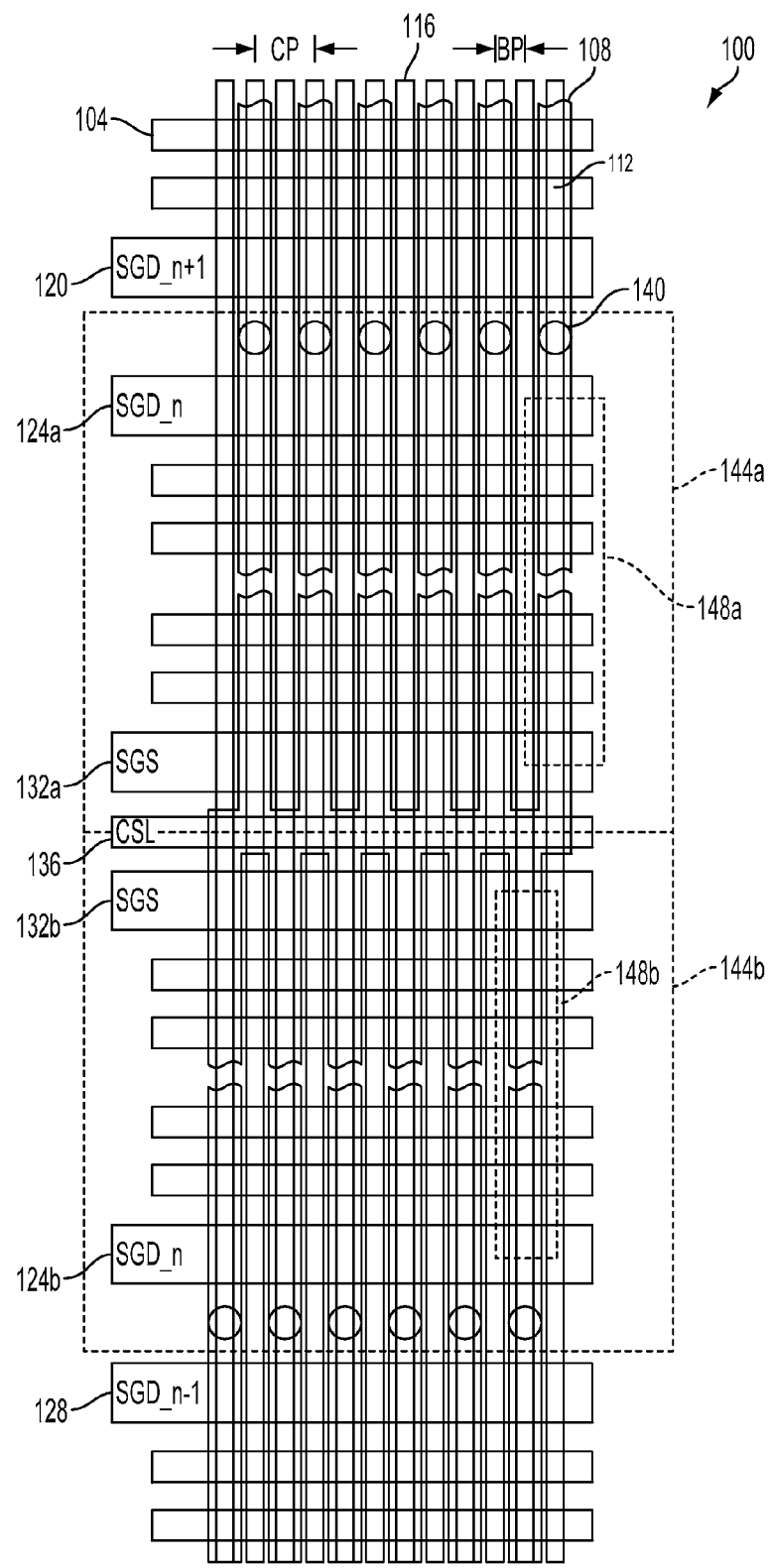
FIG. 1 illustrates a 2-D memory array in accordance with some embodiments.

FIG. 1 schematically illustrates a memory array 100 in accordance with some embodiments. The memory array 100 may be a 2-D NAND memory array having wordlines 104 and active area sections, e.g., active area strips 108, arranged orthogonal to one another, with the wordlines 104 horizontally traversing the memory array 100, and the active area strips 108 vertically traversing the memory array 100. Perspective-based descriptors, such as vertical and horizontal, may be used to facilitate discussion. These descriptors do not limit the implementations of embodiments of the disclosure.

Memory cells 112 are disposed at an overlap of the active area strips 108 and wordlines 104. The memory cells 112 may be separated from each other by a characteristic cell pitch (CP), which, as used herein, may be a distance between adjacent memory cells in a direction of the wordlines 104.

The memory array 100 may further include bitlines 116 arranged orthogonal to the wordlines 104. The bitlines 116 may be separated from each other by a characteristic bitline pitch (BP), which, as used herein, may be a distance between adjacent bitlines in a direction of the wordlines 104. As will be described below, various embodiments of the disclosure decouple the bitline pitch from the cell pitch (e.g., make the bitline pitch less than the cell pitch) in order to allow more of the memory cells 112 to be selected for each access (e.g., program or read) operation.

The memory array 100 may further include a number of electrical lines arranged parallel to the wordlines 104 that may be selectively controlled to access various sets of the memory cells 112. The electrical lines may include select gate drains (SGDs), e.g., SGD_n+1 120, SGD_n 124a and 124b, and SGD_n−1 128; select gate source (SGS) 132a and 132b; and common source line (CSL) 136. Electrical contacts 140 may serve to electrically couple bitlines 116 to the active area strips 108.

The memory array 100 may include a first sub-block 144a that has NAND strings 148a corresponding with a first subset of bitlines. The memory array 100 may also include a second sub-block 144b that has NAND strings 148b that correspond with a second subset of bitlines.

In various embodiments, each block of the memory array 100 may include a number of sub-blocks that is based on a ratio of the cell-to-bitline pitch. For example, block 144 includes two sub-blocks due to a 2:1 cell-to-bitline pitch ratio. For a general cell-to-bitline pitch ratio of n:1, there may be n sub-blocks per block.

The first and second subsets of bitlines may be non-overlapping subsets. In some embodiments, the first subset of bitlines may be interleaved with the second subset. For example, the first subset may include the even bitlines (e.g., second bitline, fourth bitline, sixth bitline, etc.), while the second subset includes the odd bitlines (e.g., first bitline, third bitline, the bitline, etc.).

The numbering of the bitlines may start from the left side of the page in FIG. 1.

A NAND string may include memory cells between an SGD and an SGS along a given active area strip. As can be seen, the NAND strings 148a and the NAND strings 148b may be offset with respect to one another. In this embodiment, every bitline may be electrically coupled to every other sub-block. So, for example, the first bitline may not be electrically coupled with sub-block 144a, may be electrically coupled with sub-block 144b, may not be electrically coupled with a sub-block below SGD_n−1 128, and so forth. This may allow for the simultaneous driving of sub-block 144a and sub-block 144b to perform various access operations.

As used herein, simultaneous operations may be operations that are entirely concurrent with one another, e.g., start and end at the same times, or partially concurrent with one another, e.g., have different start and/or end times.

Reducing the bitline pitch to half of the cell pitch and offsetting adjacent NAND strings, as shown, may effectively double the page size with respect to conventional memory arrays in which the bitline pitch and the cell pitch are the same. A page, in this context, may refer to all the memory cells (in an ABL architecture) along a pair of wordlines, with a first wordline from a first sub-block, e.g., sub-block 144a, and a second wordline from a second sub-block, e.g., sub-block 144b. The pair of wordlines may be electrically coupled with one another at an edge of the array and be driven by a single driver. In embodiments having n sub-blocks, a page may include all the memory cells (in an ABL architecture) along n wordlines, one per sub-block, with the n wordlines being electrically coupled with one another at an edge of the array and driven with the single driver.

Operating sub-block 144a simultaneously with sub-block 144b effectively provides the block 144 with a size that is twice that of a conventional memory block. The number of pages within block 144 may be the same as a conventional memory block (because the wordlines of the two sub-blocks can be driven together), but the page size doubles as a result of the 2× denser bitlines 116. With twice the number of bitlines 116 and twice the page size, it may be desirable for the sensing circuitry coupled with the memory array 100 to also be doubled.

Advantages of a mismatched cell and bitline pitch may be less dramatic in a 2-D NAND memory array, in which a cell pitch may be at or close to process capability for a given generation, than in a 3-D NAND memory array, in which cell pitch is limited by the cell characteristics and can be much greater than the process capability.

In a 3-D NAND memory array such as a pipe-shaped bit cost scalable (P-BiCS) memory array, cell pitch in the wordline direction can be expressed as: cell pitch=pillar diameter+2×gate dielectric stack thickness+control gate (e.g., wordline) thickness between cells.

With optimistic assumptions of 20 nanometers (nm) for a pillar diameter, 25 nm for a gate dielectric stack thickness, and 20 nm for a control gate thickness between cells, a cell pitch would be approximately 90 nm, which is much greater than current process capability at approximately 20 nm-29 nm half-pitch. It is possible that cell pitch in a 3-D NAND memory array may be even bigger than the above estimate when the impact of the edge profile on cell uniformity, critical dimension, and registration (e.g., alignment tolerance) margins are considered. Therefore, patterning bitlines at a pitch that is less than a cell pitch may be quite practical for a 3-D NAND memory array.

Figure 2:
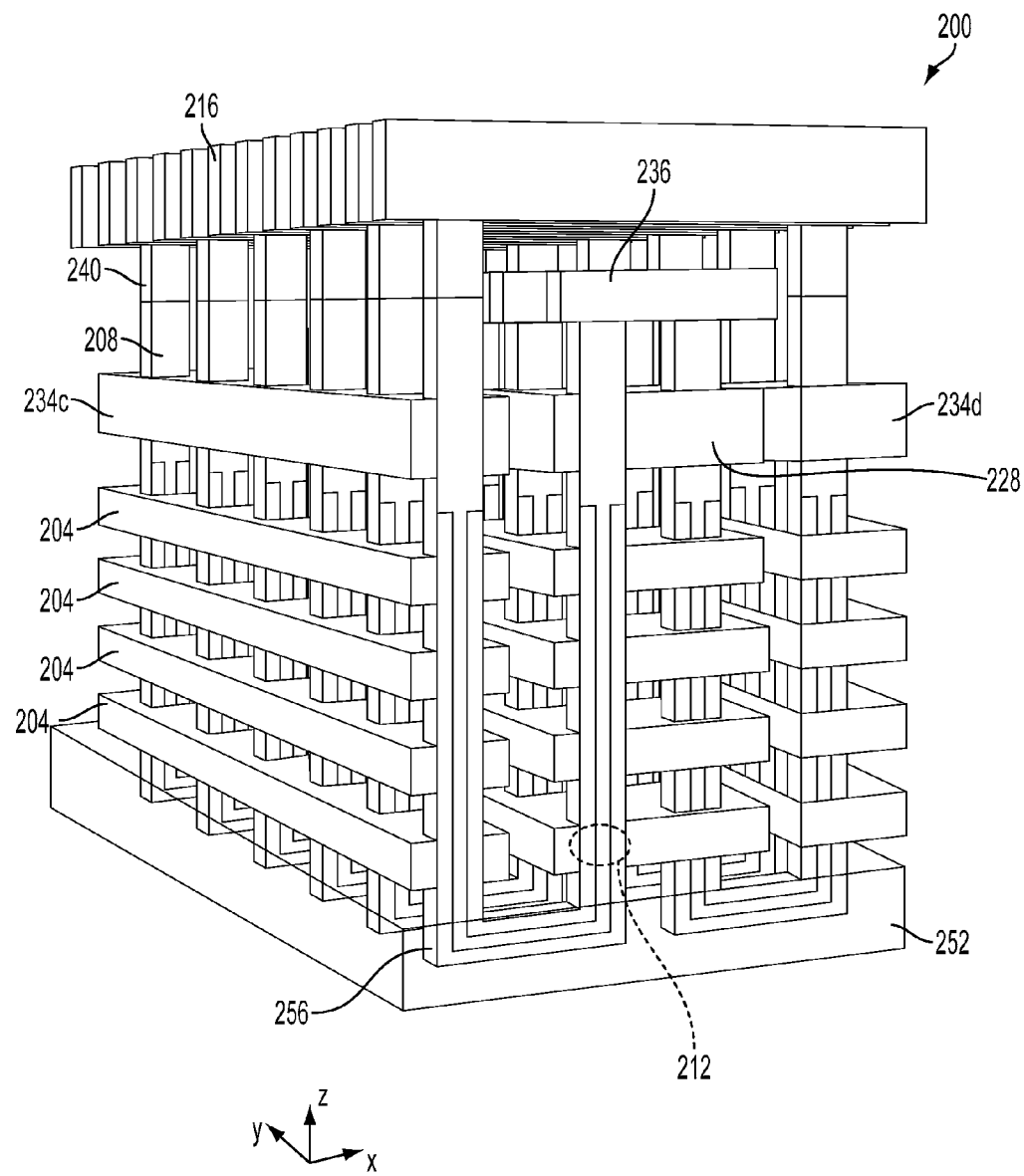
FIGS. 2 and 3 illustrate a 3-D memory array in accordance with some embodiments.
Figure 3:
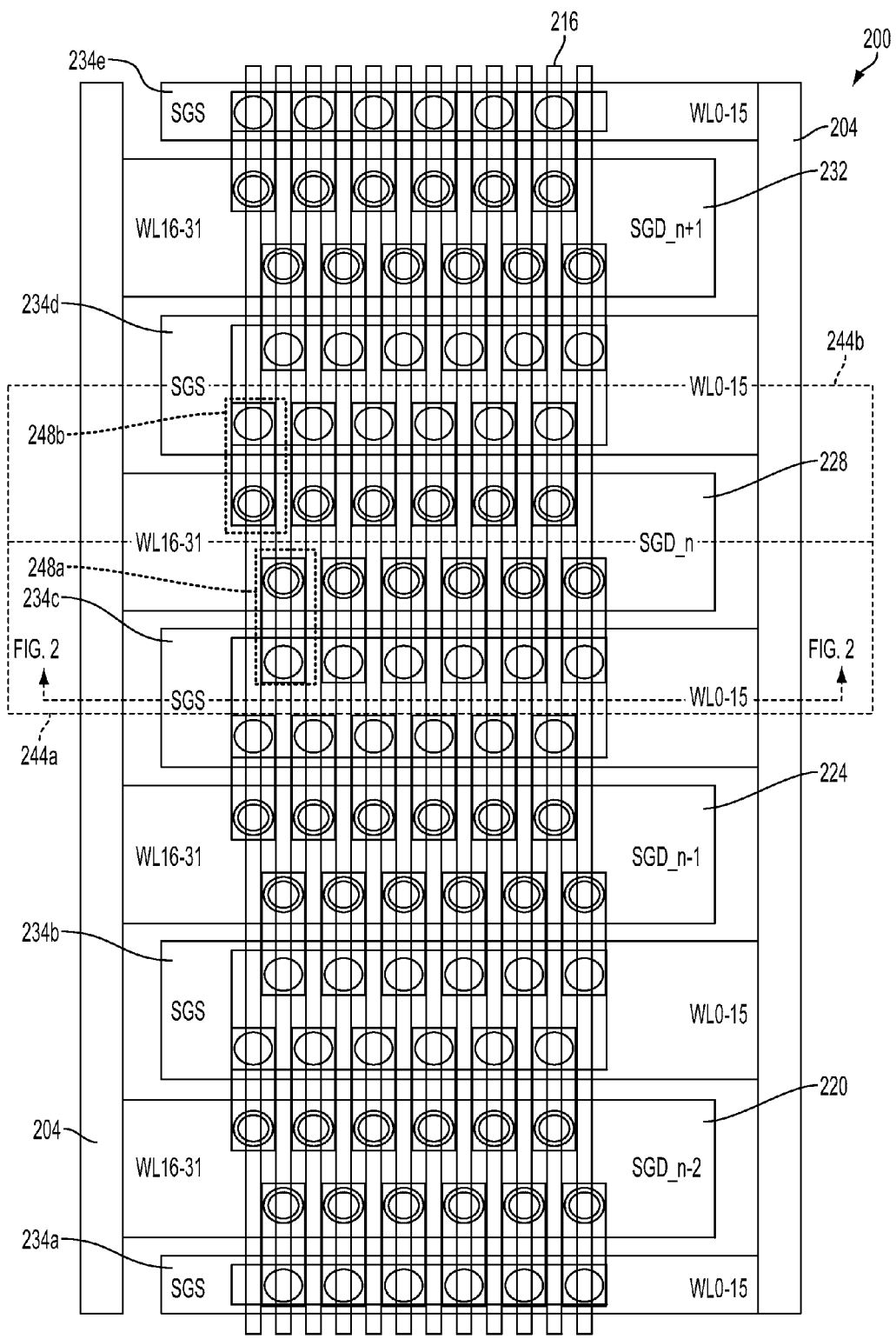

FIGS. 2 and 3 illustrate a memory array 200 from a perspective and top-plan view, respectively, in accordance with some embodiments. The memory array 200 may be a P-BiCS array; however, other embodiments may include other types of 3-D NAND memory arrays.

The memory array 200 includes wordlines 204 and active area sections, e.g., active area pillars 208, arranged orthogonal to one another, with the wordlines 204 traversing the memory array 100 in a y-direction and the active area pillars 208 traversing the memory array 200 in a z-direction. The memory array 200 may include memory cells 212 disposed at intersections of the active area pillars 208 and the wordlines 204.

The memory array 200 may also include bitlines 216 disposed at the top of the memory array 200 and traversing the memory array 200 in an x-direction. Thus, the bitlines 216 may be arranged orthogonal to both the wordlines 204 and the active area pillars 208.

In this embodiment, similar to embodiment described above with respect to FIG. 1, the bitline pitch may be decoupled from, e.g., less than, the cell pitch.

The memory array 200 may also include electrical lines arranged parallel to the wordlines 204 that may be selectively controlled to access various sets of the memory cells 212. The electrical lines may include SGDs, e.g., SGD_n−2 220, SGD_n−1 224, SGD_n 228, and SGD_n+1 232; SGS 234a, 234b, 234c, 234d, and 234e; and CSL 236. Electrical contacts 240 may serve to electrically couple bitlines 216 to the active area pillars 208.

The memory array 200 may include a first sub-block 244a that has NAND strings 248a corresponding with a first subset of the bitlines 216, e.g., the even bitlines (e.g., second bitline, fourth bitline, sixth bitline, etc.). The number of the bitlines may be with respect to the view shown in FIG. 3, with the numbering starting from the left side of the page. The memory array 200 may also include a second sub-block 244b that has NAND strings 248b corresponding with a second subset of bitlines, e.g., the odd bitlines (e.g., first bitline, third bitline, fifth bitline, etc.). The first and second subsets may be non-overlapping subsets and may be interleaved with respect to one another.

A NAND string, in this embodiment, may include memory cells between an SGD and an SGS on a given pair of active area pillars. For example, the NAND strings 248a may include memory cells of active area pillars that are disposed between the SGS 234c and an underlying substrate 252 and active area pillars between the substrate 252 and the SGD_n 228. These active area pillars may be electrically coupled with one another by an electrical connector 256 within the substrate 252. The electrical connector 256 may sometimes be referred to as a pipe connection (PC). Thus, one NAND string may include eight memory cells as shown in FIG. 2.

The NAND strings 248a and 248b may be offset with respect to one another. Thus, similar to the memory array 100, memory array 200 may provide for the simultaneous driving of the sub-blocks 244a and 244b to perform various access operations.

While the above embodiments describe a bitline pitch that is half of a cell pitch, other embodiments may have other mismatched bitline and cell pitches. Various embodiments may include any ratio of the cell-to-bitline pitch. For example, the bitline pitch may be 1/n of the cell pitch, where n is an integer greater than one.

While the above embodiments describe a cell-to-bitline pitch as binary, i.e., 2:1, other embodiments may have non-binary cell-to-bitline pitches. In a binary digital system, it may be preferable to have a binary page size, e.g., total number of bitlines in an ABL architecture, to facilitate the addressing, I/O timing, etc. If the cell-to-bitline pitch ratio is also binary, this may result in a binary number of cells fully coupled with the bitlines. However, an embodiment having a non-binary cell-to-bitline pitch may be used, with a slight over-provision of memory cells, as maintaining a binary number of bitlines may be sufficient to ensure a binary page size.

For example, consider a desired page size of 16-bits. Working off a binary 2:1 cell-to-bitline pitch ratio, an 8-cell wide array may be used with the bitlines coupled with every other sub-block. To implement a 3:1 cell-to-bitline pitch ratio, a 5-cell wide array (5>16/3) may be used with the bitlines coupling with every one in three sub-blocks. In this case, there may be a few NAND strings at an edge of the array that will not be coupled with any bitlines. However, considering a practical page size of 8 kilobytes (kB) or 16 kB, the wasted cells are a small overhead.

With mismatched bitline and cell pitch, the page size that can be supported by the technology may only be limited by the bitline pitch, not the cell pitch. As no high-aspect ratio etch is needed for bitline construction in 3-D NAND memory arrays, the bitline pitch within such arrays may be able to match bitline pitch of 2-D NAND memory arrays. Thus, the page size of the 3-D NAND memory array may be similar to 2-D NAND memory array, without having to be smaller to accommodate the larger cell pitch associated with the 3-D memory array. Even if the cell pitch of the 3-D memory arrays does not further reduce, a page size may be further scaled if the bitline pitch can be scaled through more advanced lithography.

Figure 4:
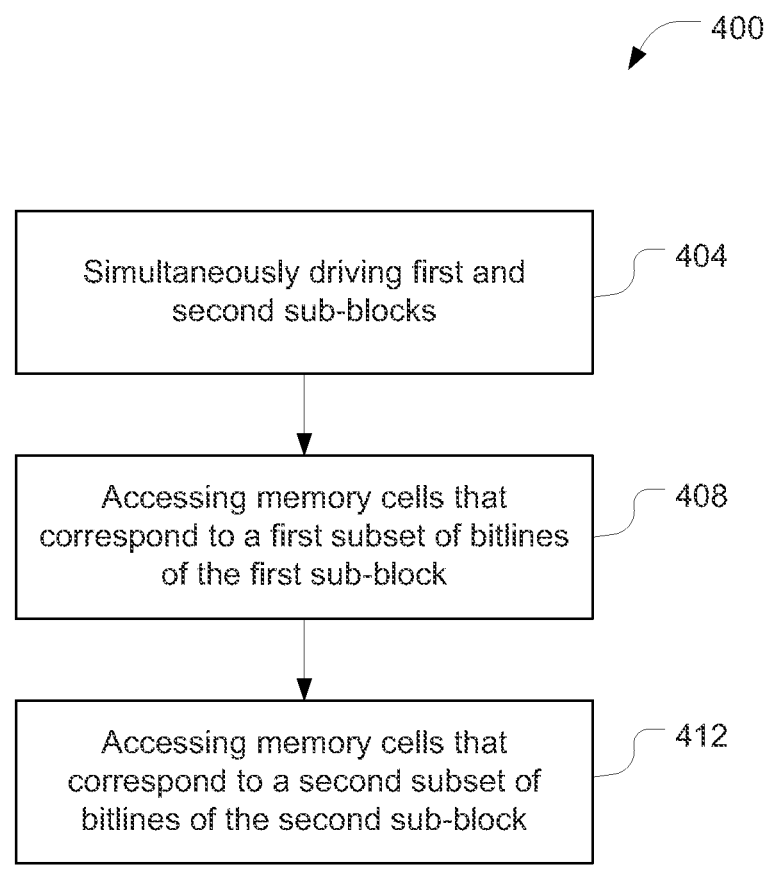
FIG. 4 illustrates a flowchart of a method of performing an access operation in accordance with some embodiments.

FIG. 4 illustrates a method 400 of performing an access operation with a memory array in accordance with some embodiments. The method 400 may be used with memory array 100 or memory array 200. The method 400 may include, at block 404, simultaneously driving first and second sub-blocks. The first and second sub-blocks may be physically and/or electrically adjacent to another and may represent one block of memory cells. Two sub-blocks may be simultaneously driven by energizing appropriate select gates. For example, with respect to memory array 100, sub-block 144a and sub-block 144b may be simultaneously driven by energizing SGD_n 124a, SGD_n 124b, and SGS 132a and 132b. With respect to memory array 200, sub-block 244a and sub-block 244b may be simultaneously driven by energizing SGD_n 228 and SGS 234c and 234d.

The method 400 may continue, at block 408, with accessing memory cells on a first subset of bitlines, e.g., even bitlines, of the first sub-block. With respect to memory array 100, the memory cells of the sub-block 144a may be accessed by energizing the first subset of bitlines and one or more wordlines of the sub-block 144a. With respect to memory array 200, the memory cells of sub-block 244b may be accessed by energizing the first subset of bitlines and selected wordlines of the sub-block 244b.

The method 400 may also include, at block 412, accessing memory cells on a second subset of bitlines, e.g., odd bitlines, of the second sub-block. With respect to memory array 100, the memory cells of the sub-block 144b may be accessed by energizing the second subset of bitlines and one or more wordlines of the sub-block 144b. With respect to memory array 200, the memory cells of sub-block 244a may be accessed by energizing the second subset of bitlines and selected wordlines of the sub-block 244a. In various embodiments, blocks 408 and 412 may be performed simultaneously with one another and with block 404.

While the above embodiment describes a method with respect to two subsets of bitlines, other embodiments may include greater numbers of subsets, e.g., when the cell-to-bitline pitch ratio is greater than 2:1. Furthermore, while the above embodiment describes a method of driving two sub-blocks simultaneously with one another, other embodiments may include driving more than two sub-blocks simultaneously with one another. For example, in an embodiment with a block having n sub-blocks, up to n sub-blocks may be driven simultaneously with one another.

Figure 5:
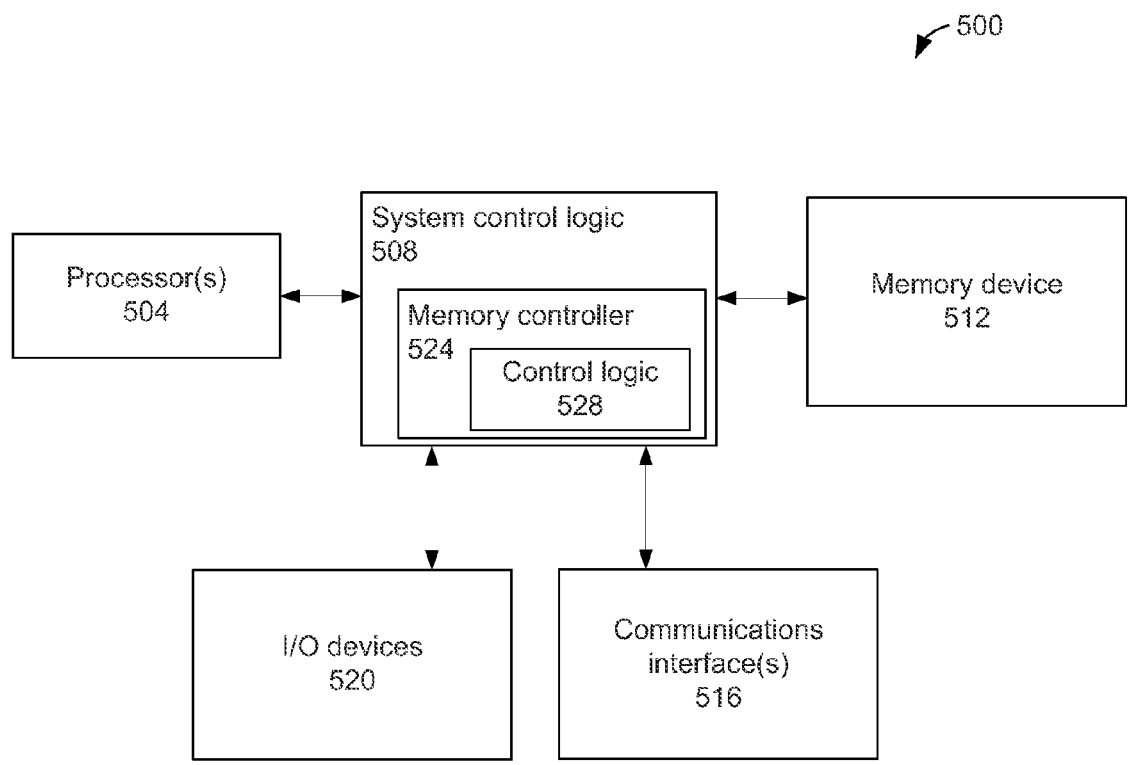
FIG. 5 illustrates an example system in accordance with some embodiments.

The memory arrays and methods described herein may be implemented into a system using any suitable hardware and/or software to configure as desired. FIG. 5 illustrates, for one embodiment, an example system 500 comprising system control logic 508 coupled to one or more processor(s) 504; a memory device 512; one or more communications interface(s) 516; and input/output (I/O) devices 520.

The memory device 512 may be a non-volatile computer storage chip that includes the memory array 100 or the memory array 200. In addition to the memory array, the memory device 512 may include a package, having the memory array disposed therein, driver circuitry (e.g., drivers), input/output connections to electrically couple the memory device 512 with other components of the system 500, etc. The memory device 512 may be configured to be removably or permanently coupled with the system 500.

Communications interface(s) 516 may provide an interface for system 500 to communicate over one or more network(s) and/or with any other suitable device. Communications interface(s) 516 may include any suitable hardware and/or firmware. Communications interface(s) 516 for one embodiment may include, for example, a network adapter, a wireless network adapter, a telephone modem, and/or a wireless modem. For wireless communications, communications interface(s) 516 for one embodiment may use one or more antennas to communicatively couple the system 500 with a wireless network.

For one embodiment, at least one of the processor(s) 504 may be packaged together with logic for one or more controller(s) of system control logic 508. For one embodiment, at least one of the processor(s) 504 may be packaged together with logic for one or more controllers of system control logic 508 to form a System in Package (SiP). For one embodiment, at least one of the processor(s) 504 may be integrated on the same die with logic for one or more controller(s) of system control logic 508. For one embodiment, at least one of the processor(s) 504 may be integrated on the same die with logic for one or more controller(s) of system control logic 508 to form a System on Chip (SoC).

System control logic 508 for one embodiment may include any suitable interface controllers to provide for any suitable interface to at least one of the processor(s) 504 and/or to any suitable device or component in communication with system control logic 508. The system control logic 508 may move data into and/or out of the various components of the system 500.

System control logic 508 for one embodiment may include a memory controller 524 to provide an interface to the memory device 512 to control various access operations such as those described above with respect to the method 400 of FIG. 4. The memory controller 524 may include control logic 528 that is specifically configured to control the memory device 512 as described herein. In various embodiments, the control logic 528 may include instructions stored in a non-transitory computer readable medium (e.g., the memory device 512 or other memory/storage) that, when executed by at least one of the processor(s) 504 cause the memory controller 524 to perform the above-described operations.

In various embodiments, the I/O devices 520 may include user interfaces designed to enable user interaction with the system 500, peripheral component interfaces designed to enable peripheral component interaction with the system 500, and/or sensors designed to determine environmental conditions and/or location information related to the system 500. In various embodiments, the user interfaces could include, but are not limited to, a display, e.g., a liquid crystal display, a touch screen display, etc., a speaker, a microphone, one or more digital cameras to capture pictures and/or video, a flashlight (e.g., a light emitting diode flash), and a keyboard. In various embodiments, the peripheral component interfaces may include, but are not limited to, a non-volatile memory port, an audio jack, and a power supply interface. In various embodiments, the sensors may include, but are not limited to, a gyro sensor, an accelerometer, a proximity sensor, an ambient light sensor, and a positioning unit. The positioning unit may additionally/alternatively be part of, or interact with, the communication interface(s) 516 to communicate with components of a positioning network, e.g., a global positioning system (GPS) satellite.

In various embodiments, the system 500 may be a mobile computing device such as, but not limited to, a laptop computing device, a tablet computing device, a netbook, a smartphone, etc.; a desktop computing device; a workstation; a server; etc. The system 500 may have more or less components, and/or different architectures.

Although certain embodiments have been illustrated and described herein for purposes of description, a wide variety of alternate and/or equivalent embodiments or implementations calculated to achieve the same purposes may be substituted for the embodiments shown and described without departing from the scope of the present disclosure. This application is intended to cover any adaptations or variations of the embodiments discussed herein. Therefore, it is manifestly intended that embodiments described herein be limited only by the claims and the equivalents thereof.

What is claimed is:

1. A NAND memory array comprising:
a plurality of wordlines of the NAND memory array;
a first stack of cells, with individual cells where a first active area section passes through individual wordlines, the first stack of cells to couple electrically a first bitline; and
a second stack of cells substantially parallel to the first stack of cells, with individual cells where a second active area section passes through individual wordlines, the second stack of cells to couple electrically a second bitline different from the first bitline, the second bitline substantially parallel to the first bitline, wherein the second stack of cells being a stack of cells physically closest to the first stack of cells;
wherein a distance as measured from the first stack of cells to the second stack of cells is greater than a distance as measured from the first bitline to the second bitline.

2. The NAND memory array of claim 1, wherein the NAND memory array comprises a NAND memory array in a three dimensional memory device.

3. The NAND memory array of claim 2, wherein the first and second stacks of cells comprise vertical NAND strings.

4. The NAND memory array of claim 3, wherein the NAND strings comprise multiple memory cells in a vertical stack and coupled electrically between a common select line and a string select line.

5. The NAND memory array of claim 3, wherein the NAND strings comprise at least one active memory cell where the active area section passes through an active wordline, and at least one dummy cell where the active area section passes through an inactive wordline.

6. The NAND memory array of claim 1, wherein the plurality of wordlines comprises multiple conductive lines disposed in a plane substantially parallel to a substrate of the NAND memory array.

7. The NAND memory array of claim 6, wherein the plurality of wordlines comprises a vertical stack of multiple layers of wordlines, the multiple layers substantially parallel to the substrate and to each other, the multiple layers of wordlines to intersect the active area sections to form a vertical stack of cells.

8. The NAND memory array of claim 1, wherein the distance as measured from the first stack of cells to the second stack of cells is approximately twice the distance as measured from the first bitline to the second bitline.

9. The NAND memory array of claim 1, wherein the NAND memory array is organized with first and second sub-blocks of cells, wherein the first sub-block comprises the first stack of cells and the second sub-block comprises the second stack of cells, and wherein a cell in one sub-block is to be accessed separately from a cell in the other sub-block.

10. The NAND memory array of claim 9, wherein the first bitline is to couple to the first sub-block and not the second sub-block, and wherein the second bitline is to couple to the second sub-block and not the first sub-block.

11. The NAND memory array of claim 1, wherein the distance as measured from the first stack of cells to the second stack of cells comprises a distance as measured from a center of where the first active area section passes through the individual wordline for the first stack of cells to a center of where the second active area section passes through the individual wordline for the second stack of cells.

12. The NAND memory array of claim 1, wherein the distance as measured from the first bitline to the second bitline comprises a distance from a center of the first bitline to a center of the second bitline.

13. A system comprising:
   a NAND memory array including
      a plurality of wordlines;
      a first stack of cells, with individual cells where a first active area section passes through individual wordlines, the first stack of cells to couple electrically a first bitline; and
      a second stack of cells substantially parallel to the first stack of cells, with individual cells where a second active area section passes through individual wordlines, the second stack of cells to couple electrically a second bitline different from the first bitline, the second bitline substantially parallel to the first bitline, wherein the second stack of cells of cells being a stack of cells physically closest to the first stack of cells;
      wherein a distance as measured from the first stack of cells to the second stack of cells is greater than a distance as measured from the first bitline to the second bitline; and
   a memory controller communicatively coupled to the NAND memory array.

14. The system of claim 13, wherein the NAND memory array comprises a NAND memory array in a three dimensional memory device.

15. The system of claim 14, wherein the first and second stacks of cells comprise vertical NAND strings.

16. The system of claim 15, wherein the NAND strings comprise multiple memory cells in a vertical stack and coupled electrically between a common select line and a string select line.

17. The system of claim 15, wherein the NAND strings comprise at least one active memory cell where the active area section passes through an active wordline, and at least one dummy cell where the active area section passes through an inactive wordline.

18. The system of claim 13, wherein the plurality of wordlines comprises multiple conductive lines disposed in a plane substantially parallel to a substrate of the NAND memory array.

19. The system of claim 18, wherein the plurality of wordlines comprises a vertical stack of multiple layers of wordlines, the multiple layers substantially parallel to the substrate and to each other, the multiple layers of wordlines to intersect the active area sections to form a vertical stack of cells.

20. The system of claim 13, wherein the distance as measured from the first stack of cells to the second stack of cells is approximately twice the distance as measured from the first bitline to the second bitline.

21. The system of claim 13, wherein the NAND memory array is organized with first and second sub-blocks of cells, wherein the first sub-block comprises the first stack of cells and the second sub-block comprises the second stack of cells, and wherein a cell in one sub-block is to be accessed separately from a cell in the other sub-block.

22. The system of claim 21, wherein the first bitline is to couple to the first sub-block and not the second sub-block, and wherein the second bitline is to couple to the second sub-block and not the first sub-block.

23. The system of claim 13, wherein the memory controller is to control access to the NAND memory array in accordance with an all bitline (ABL) architecture.

24. The system of claim 13, wherein the memory controller is to control access to the NAND memory array in accordance with a shielded bitline (SBL) architecture.

25. The system of claim 13, wherein the distance as measured from the first stack of cells to the second stack of cells comprises a distance as measured from a center of where the first active area section passes through the individual wordline for the first stack of cells to a center of where the second active area section passes through the individual wordline for the second stack of cells.

26. The system of claim 13, wherein the distance as measured from the first bitline to the second bitline comprises a distance from a center of the first bitline to a center of the second bitline.

27. The system of claim 13, further comprising one or more of:
   at least one processor communicatively coupled to the memory controller;
   a display communicatively coupled to display data from the memory device;
   a battery to power the system; or
   a network interface communicatively coupled to exchange data stored in the memory device with a remote device over a network connection.

* * * * *